(12) United States Patent
Hamamoto (10) Patent No.: US 9,246,043 B2
(45) Date of Patent: Jan. 26, 2016

(54) MANUFACTURING METHOD OF PHOTOVOLTAIC DEVICE AND MANUFACTURING APPARATUS FOR PHOTOVOLTAIC DEVICE

(75) Inventor: Satoshi Hamamoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/364,855

(22) PCT Filed: Feb. 1, 2012

(86) PCT No.: PCT/JP2012/052276
§ 371 (c)(1),
(2), (4) Date: Jun. 12, 2014

(87) PCT Pub. No.: WO2013/114589
PCT Pub. Date: Aug. 8, 2013

(65) Prior Publication Data
US 2014/0302629 A1    Oct. 9, 2014

(51) Int. Cl.
*H01L 21/306* (2006.01)
*H01L 31/18* (2006.01)
*H01L 21/223* (2006.01)
(Continued)

(52) U.S. Cl.
CPC ............. *H01L 31/18* (2013.01); *H01L 21/223* (2013.01); *H01L 21/225* (2013.01); *H01L 21/30604* (2013.01); *H01L 21/30608* (2013.01); *H01L 21/6708* (2013.01); *H01L 21/67063* (2013.01);
(Continued)

(58) Field of Classification Search
CPC .................. H01L 21/02365; H01L 21/02612
See application file for complete search history.

(56) References Cited

U.S. PATENT DOCUMENTS

| 5,340,437 A | 8/1994 | Erk et al. |
| 5,800,725 A | 9/1998 | Kato et al. |

(Continued)

FOREIGN PATENT DOCUMENTS

| JP | 02-185032 A | 7/1990 |
| JP | 03-272140 A | 12/1991 |

(Continued)

OTHER PUBLICATIONS

International Search Report (PCT/ISA/210) mailed on Feb. 28, 2012, by the Japanese Patent Office as the International Searching Authority for International Application No. PCT/JP2012/052276.

(Continued)

*Primary Examiner* — Cheung Lee
(74) *Attorney, Agent, or Firm* — Buchanan Ingersoll & Rooney PC (57) ABSTRACT

A manufacturing method includes a step of forming an impurity diffusion layer by diffusing an impurity element in a surface of a silicon-based substrate; and an etching step of removing the impurity diffusion layer in at least a portion of a first-surface side of the silicon-based substrate, wherein the etching step includes an etching-fluid supplying step of, on the first-surface side, supplying an etching fluid that flows to an outer edge portion of the silicon-based substrate from a supply position, and an air supplying step of, on a second-surface side, which is opposite to the first-surface side, of the silicon-based substrate, supplying air in a same direction as the etching fluid in accordance with supply of the etching fluid at the etching-fluid supplying step.

7 Claims, 7 Drawing Sheets

(51) Int. Cl.
*H01L 31/068* (2012.01)
*H01L 21/225* (2006.01)
*H01L 21/67* (2006.01)

(52) U.S. Cl.
CPC .......... *H01L 31/068* (2013.01); *H01L 31/1804* (2013.01); *Y02E 10/547* (2013.01)

(56) References Cited

U.S. PATENT DOCUMENTS

| | | | |
|---|---|---|---|
| 2007/0161247 | A1 | 7/2007 | Koyata et al. |
| 2008/0000519 | A1* | 1/2008 | Takahashi ..................... 136/252 |
| 2008/0233760 | A1 | 9/2008 | Delahaye |
| 2009/0117749 | A1 | 5/2009 | Koyata et al. |
| 2010/0055924 | A1* | 3/2010 | Ganesan et al. .............. 438/748 |

FOREIGN PATENT DOCUMENTS

| | | |
|---|---|---|
| JP | 06-244167 A | 9/1994 |
| JP | 08-502148 A | 3/1996 |
| JP | 09-270400 A | 10/1997 |
| JP | 10-092712 A | 4/1998 |
| JP | 11-288903 A | 10/1999 |
| JP | 2007-027492 A | 2/2007 |
| JP | 2007-529912 A | 10/2007 |
| WO | WO 2005/093788 | 10/2005 |

OTHER PUBLICATIONS

Written Opinion (PCT/ISA/237) mailed on Feb. 28, 2012, by the Japanese Patent Office as the International Searching Authority for International Application No. PCT/JP2012/052276.

Office Action (Notice of Rejection) issued on Nov. 4, 2014, by the Japanese Patent Office in corresponding Japanese Patent Application No. 2013-556142, and an English translation of the Office Action. (5 pages).

Official Action issued by the State Intellectual Property Office of the People's Republic of China on Aug. 25, 2015 in Chinese Application No. 201280067059.1 and English language translation of Official Action (11 PGS).

* cited by examiner

MANUFACTURING METHOD OF PHOTOVOLTAIC DEVICE AND MANUFACTURING APPARATUS FOR PHOTOVOLTAIC DEVICE

FIELD

The present invention relates to a manufacturing method of a photovoltaic device and a manufacturing apparatus for a photovoltaic device, and particularly to a method of removing a junction of an unnecessary portion among junctions formed over the entire surface of a silicon-based substrate.

BACKGROUND

A photovoltaic device, such as a solar cell, is designed, in order to improve its performance, to capture solar light inside the device with high efficiency and to convert the captured light energy into electrical energy with high efficiency. One of the efforts to improve the performance is an effort in separating a PN junction. Most solar cells formed of a semiconductor material generate electrical power using photovoltaic power at a junction. Particularly, in a case of using crystalline silicon as the material, a PN junction is often formed by thermal diffusion.

As a method of forming a PN junction, thermal diffusion is known as a method that is excellent in terms of mass productivity and cost. However, in a thermal diffusion method, diffusion extends to the entire exposed potion of a substrate including the light-receiving surface (the front surface) and the back surface of the substrate. In the solar cell, it is necessary to form a PN junction on the light-receiving-surface side of the substrate, and a PN junction is not necessary on the back-surface side, which is the opposite side of the light-receiving surface, and the side surface of the substrate. If the PN junction is left on the light-receiving-surface side, the back-surface side, and the side surface, a short-circuit of a current is likely to occur between the light-receiving-surface side and the back-surface side, resulting in loss of the function as a solar cell.

For this reason, a process of manufacturing a photovoltaic device includes a process of separating or insulating an unnecessary junction between the light-receiving-surface side and the back-surface side. Specifically, a method such as, mainly, dry etching by plasma discharge, laser processing, and wet etching is often employed.

In the process of separating or insulating a junction, one of the points to be considered in order to improve the performance of the photovoltaic device and increase the efficiency is controllability in accurately leaving a junction in a necessary portion and removing a junction in a portion where a junction needs to be removed. Another point to be considered is to reduce damage on the substrate due to the processing as much as possible in order to reduce an adverse effect on the characteristics of the photovoltaic device.

While dry etching and laser processing do not cause many problems when they are applied to a standard solar cell, in order to increase the efficiency of the solar cell, dry etching and laser processing are unsuitable because they are inferior in controllability or reduction of damage. Wet etching is suitable for increasing the efficiency of the solar cell as a method of achieving both good controllability and reduction of damage.

Regarding junction separation by wet etching, for example, Patent Literature 1 proposes a technique of removing a junction on the back-surface side while leaving a junction on the light-receiving-surface side by precisely controlling a positional relationship of the fluid surface and the substrate in the height direction.

CITATION LIST

Patent Literature

Patent Literature 1: International Publication No. WO2005/093788

SUMMARY

Technical Problem

According to the technique described in Patent Literature 1, desired junction separation can be achieved by wet etching. However, in this method, in order to precisely control the positional relationship between the fluid surface and the substrate as well as to arrange the substrates in parallel in the horizontal direction, a fluid bath having an extremely large area is necessary to process a large number of substrates, which results in increasing the size of the apparatus. In order to maintain the precise control of the fluid surface and the substrate, the conveying speed of the substrate and the etching rate are limited. Furthermore, in order to maintain consistency between the processes, processes of cleaning, drying, and the like after the etching are performed in a form similar to that of the etching. These conditions may become a factor in impeding increase of productivity.

The present invention has been achieved in view of the above and an object of the present invention is to provide a manufacturing method of a photovoltaic device and a manufacturing apparatus for a photovoltaic device that enable junction separation with good controllability and less damage and that enable achievement of high productivity with a compact-sized manufacturing apparatus.

Solution to Problem

In order to solve the above problems and achieve the object, the present invention includes a step of forming an impurity diffusion layer by diffusing an impurity element in a surface of a silicon-based substrate; and an etching step of removing the impurity diffusion layer in at least a portion of a first-surface side of the silicon-based substrate, wherein the etching step includes an etching-fluid supplying step of, on the first-surface side, supplying an etching fluid toward an outer edge portion of the silicon-based substrate from a supply position, and an air supplying step of, on a second-surface side, which is opposite to the first-surface side, of the silicon-based substrate, supplying air in a same direction as the etching fluid in accordance with supply of the etching fluid at the etching-fluid supplying step.

Advantageous Effects of Invention

According to the manufacturing method of a photovoltaic device of the present invention, junction separation can be performed with good controllability and less damage by wet etching using an etching fluid. By supplying air to a second-surface side while supplying the etching fluid to a desired position on a first-surface side, the etching fluid is prevented from flowing to the second-surface side from the side surface of the silicon-based substrate, which enables a range where a junction is to be removed to be accurately limited. An appropriate etching rate and air spray power can be set with less constraint. Furthermore, the etching process can be performed in a compact-sized apparatus. Accordingly, effects are obtained where junction separation can be achieved with good controllability and less damage and high productivity can be achieved with a compact-sized manufacturing apparatus.

BRIEF DESCRIPTION OF DRAWINGS

FIG. 1-1 is a cross-sectional view of the schematic configuration of a solar cell produced by a manufacturing method of a photovoltaic device according to a first embodiment of the present invention.

FIG. 1-2 is a top view of the schematic configuration of the solar cell produced by the manufacturing method of a photovoltaic device according to the first embodiment of the present invention.

FIG. 1-3 is a bottom view of the schematic configuration of the solar cell produced by the manufacturing method of a photovoltaic device according to the first embodiment of the present invention.

FIG. 2-1 is a cross-sectional view for explaining the procedure of the manufacturing method of a photovoltaic device according to the first embodiment (part 1).

FIG. 2-2 is a cross-sectional view for explaining the procedure of the manufacturing method of a photovoltaic device according to the first embodiment (part 2).

FIG. 2-3 is a cross-sectional view for explaining the procedure of the manufacturing method of a photovoltaic device according to the first embodiment (part 3).

FIG. 2-4 is a cross-sectional view for explaining the procedure of the manufacturing method of a photovoltaic device according to the first embodiment (part 4).

FIG. 2-5 is a cross-sectional view for explaining the procedure of the manufacturing method of a photovoltaic device according to the first embodiment (part 5).

FIG. 2-6 is a cross-sectional view for explaining the procedure of the manufacturing method of a photovoltaic device according to the first embodiment (part 6).

FIG. 2-7 is a cross-sectional view for explaining the procedure of the manufacturing method of a photovoltaic device according to the first embodiment (part 7).

DESCRIPTION OF EMBODIMENTS

Exemplary embodiments of a manufacturing method of a photovoltaic device and a manufacturing apparatus for a photovoltaic device according to the present invention will be explained below in detail with reference to the drawings. The present invention is not limited to the following descriptions and can be modified appropriately without departing from the scope of the invention. In the drawings explained below, scale sizes of respective members may be different from actual products in some cases to facilitate understanding, and this similarly applies to relationships between the respective drawings.

First Embodiment

Figure 11:
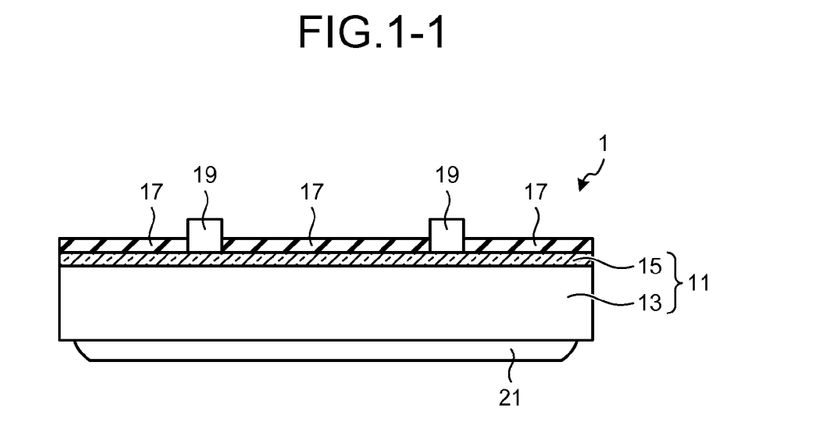
Figure 12:
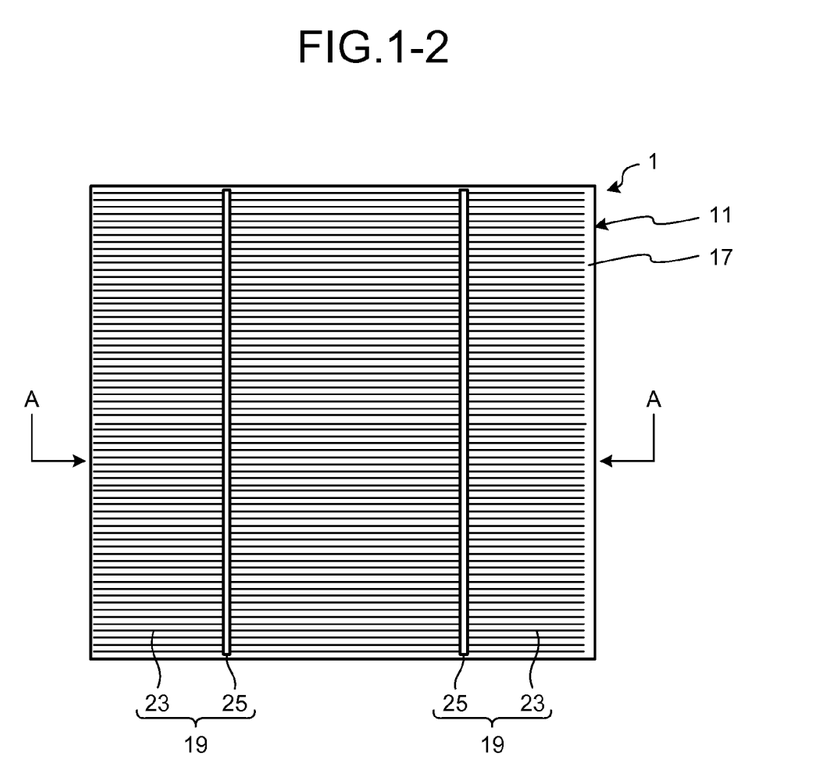
Figure 13:
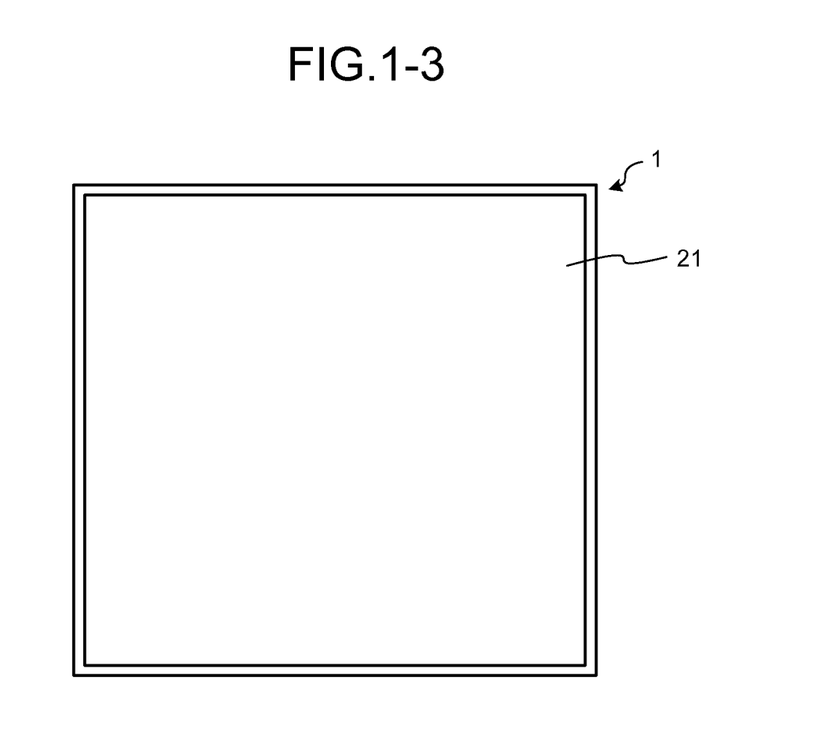

FIGS. 1-1 to 1-3 depict schematic configurations of a solar cell produced by a manufacturing method of a photovoltaic device according to a first embodiment of the present invention. FIG. 1-1 is a cross-sectional view of the solar cell. FIG. 1-2 is a top view of the solar cell viewed from a light-receiving-surface side. FIG. 1-3 is a bottom view of the solar cell viewed from a back-surface side that is opposite to the light-receiving surface. FIG. 1-1 depicts an A-A cross section shown in FIG. 1-2.

A solar cell 1 is a solar cell substrate having a photoelectric conversion function. As shown in FIGS. 1-1 to 1-3, the solar cell 1 includes a semiconductor substrate 11, an anti-reflective film 17, a light-receiving-surface-side electrode 19, and a back-surface-side electrode 21. The semiconductor substrate 11 includes a PN junction. The anti-reflective film 17 is formed on the surface (the front surface) of the semiconductor substrate 11 on the light-receiving-surface side. The anti-reflective film 17 prevents reflection of incident light at the light-receiving surface.

The light-receiving-surface-side electrode 19 is a first electrode formed such that it is surrounded by the anti-reflective film 17 on the surface (the front surface) of the semiconductor substrate on the light-receiving-surface side. The back-surface-side electrode 21 is a second electrode formed on the surface (the back surface) on the opposite side of the light-receiving surface of the semiconductor substrate 11.

The semiconductor substrate 11 includes a P-type (first conductivity-type) polycrystalline silicon layer 13 and an N-type (second conductivity-type) impurity diffusion layer 15 obtained by inverting the conductivity type of the surface of the P-type polycrystalline silicon layer 13. With this configuration, a PN junction is configured in the semiconductor substrate 11.

In the semiconductor substrate 11, a microroughness (not shown) is formed in high density as a textured structure on the surface of the N-type impurity diffusion layer 15 on the light-receiving-surface side. The microroughness has a function of suppressing the substantial reflectance through multiple reflection particularly by changing the angle of the reflected light on the light-receiving surface and confining the light.

The light-receiving-surface-side electrode 19 includes surface silver grid electrodes 23 and surface silver bus electrodes 25 of the solar cell 1. The surface silver grid electrodes 23 are locally provided on the light-receiving surface in order to collect electricity generated in the semiconductor substrate 11. The surface silver bus electrodes 25 are provided substantially perpendicular to the surface silver grid electrodes 23 in order to extract the electricity collected by the surface silver grid electrodes 23. The back-surface-side electrode 21 is formed substantially over the entire back surface of the semiconductor substrate 11 except a region that is, for example, about 0.5 to 2 millimeters from the edge of each side of the rectangle defining the back surface of the semiconductor substrate 11.

In the solar cell 1 configured in the above manner, when the PN junction surface (the junction surface of the P-type polycrystalline silicon layer 13 and the N-type impurity diffusion layer 15) of the semiconductor substrate 11 is irradiated with solar light from the light-receiving-surface side of the solar cell 1, holes and electrons are generated. The generated electrons move toward the N-type impurity diffusion layer 15 and the holes move toward the P-type polycrystalline silicon layer 13 due to the electric field of the PN junction surface.

Electrons become excessive in the N-type impurity diffusion layer 15 and holes become excessive in the P-type polycrystalline silicon layer 13, whereby photovoltaic power is generated. This photovoltaic power is generated in the direction in which the PN junction is forward biased; therefore, the light-receiving-surface-side electrode 19 connected to the N-type impurity diffusion layer 15 becomes a negative electrode and the back-surface-side electrode 21 connected to the P-type polycrystalline silicon layer 13 becomes a positive electrode. As a result, a current flows in an external circuit (not shown).

Next, an example of a manufacturing method of the solar cell 1 as described above is explained with reference to FIGS. 2-1 to 2-7. FIGS. 2-1 to 2-7 are cross-sectional views for explaining the procedure of the manufacturing method of the photovoltaic device according to the first embodiment.

Figure 21:
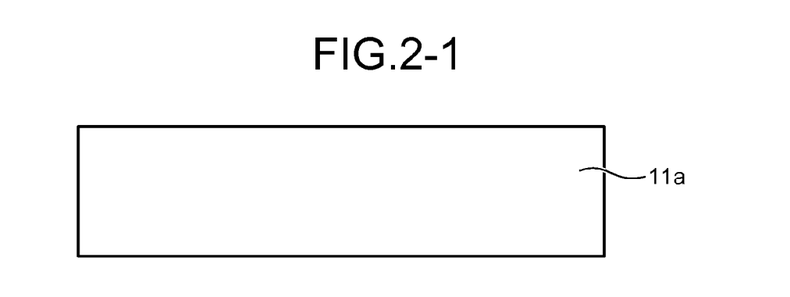

As a silicon-based substrate that is to be a semiconductor substrate, for example, a P-type polycrystalline silicon substrate 11a is prepared, which is most commonly used for a consumer solar cell (see FIG. 2-1). Although the thickness and the size of the P-type polycrystalline silicon substrate 11a are not particularly limited, in the present embodiment, the P-type polycrystalline silicon substrate 11a has a thickness of 200 micrometers and a size of 150 mm×150 mm, as an example.

The P-type polycrystalline silicon substrate 11a is manufactured by slicing, with a wire saw, an ingot obtained by cooling and solidifying molten silicon; therefore, the surface of the P-type polycrystalline silicon substrate 11a has a damage caused by the slicing (a damaged layer). This damaged layer on the surface layer has a considerably low crystallinity; therefore, in order to achieve a sufficient function as a semiconductor device, it is necessary to remove the damaged layer. First, in order also to remove this damaged layer, the surface of the P-type polycrystalline silicon substrate 11a is etched by immersing the P-type polycrystalline silicon substrate 11a in acid or a heated alkali solution, such as aqueous sodium hydroxide solution, whereby the damaged area, which is generated at the time of slicing the silicon substrate and is present near the surface of the P-type polycrystalline silicon substrate 11a, is removed.

After the damaged layer is removed, microroughness as a textured structure is formed on the surface of the P-type polycrystalline silicon substrate 11a on the light-receiving-surface side. The textured structure is formed by, for example, etching the P-type polycrystalline silicon substrate 11a with aqueous alkali hydroxide solution containing IPA.

By providing such a textured structure on the light-receiving-surface side of the P-type polycrystalline silicon substrate 11a, multiple reflection of light is caused to occur on the light-receiving-surface side of the solar cell 1. By causing the light incident on the solar cell 1 to be efficiently captured inside the semiconductor substrate 11, the reflectance is effectively reduced and thus the conversion efficiency can be improved. In FIGS. 2-2 to 2-7, the microroughness is not illustrated.

Figure 22:
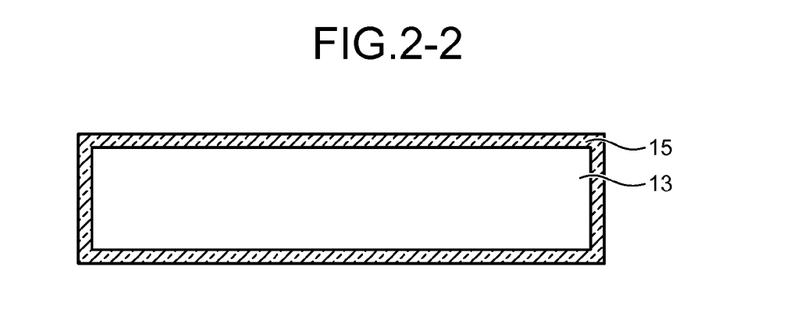

Subsequently, the P-type polycrystalline silicon substrate 11a on the surface of which the microroughness is formed as a textured structure is put into a thermal oxidation furnace and is heated under an atmosphere of phosphorous, which is an N-type impurity. With this process, phosphorus, which is an impurity element, is diffused in the surface of the P-type polycrystalline silicon substrate 11a, thereby forming the N-type impurity diffusion layer 15 (see FIG. 2-2). A portion of the P-type polycrystalline silicon substrate 11a on the inner side with respect to the surface layer, on which the N-type impurity diffusion layer 15 is formed, becomes the P-type polycrystalline silicon layer 13. With this process, the semiconductor substrate 11 including the PN junction is obtained.

In the present embodiment, the N-type impurity diffusion layer 15 is formed by heating the P-type polycrystalline silicon substrate 11a in phosphorous oxychloride ($POCl_3$) gas atmosphere at a temperature of, for example, 800° C. to 850° C. Furthermore, the diffusion of phosphorous is controlled such that the sheet resistance of the N-type impurity diffusion layer 15 becomes 30Ω/□ to 100Ω/□, and preferably, 50Ω/□ to 80Ω/□.

Figure 23:
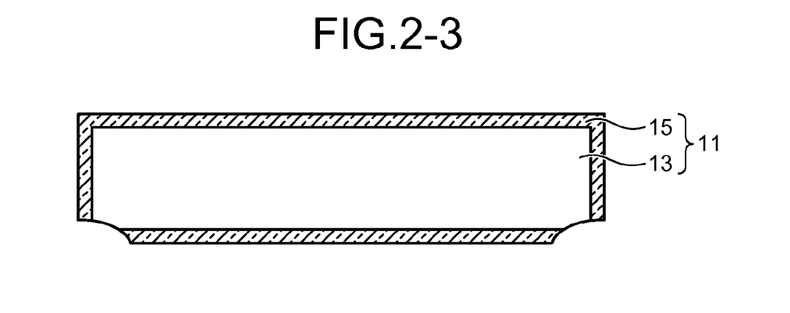

Subsequently, in the etching process of removing the N-type impurity diffusion layer 15, separation of the PN junction is performed in the semiconductor substrate 11 (see FIG. 2-3). In the present embodiment, the N-type impurity diffusion layer 15 is removed at the outer edge portion and the proximity thereof on a first surface, which is to be the back-surface side, of the semiconductor substrate 11. Details of the etching process are described later.

It is desirable to perform the separation of the junction between the diffusion process and the deposition process of the anti-reflective film, as in the present embodiment. In principle, the separation of the junction can be performed in any stage after junction formation; therefore, it does not impede the separation of the junction in other stages. However, in many cases, additional protections or measures are required for constituent elements that are formed later (such as an anti-reflective film or an electrode) or byproducts if any byproducts are generated. Therefore, in order to avoid such complication, it is desirable to perform the separation of the junction in this stage.

Although it is necessary to remove phosphorous glass, which is a byproduct of the diffusion, between the diffusion process and the deposition process of the anti-reflective film, it suffices to select the order of these two processes according to the etchant to be used. Most etchants for dissolving silicon also dissolve phosphorous glass with a certain degree of selectivity. In this case, it is more desirable to first remove the junction together with the phosphorous glass in the portion where the junction needs to be separated and then to remove the phosphorous glass in the other areas.

In this case, as the phosphorous glass in the portions other than the portion where the junction is to be separated can be used as a temporary protective film, it is possible to further specifically define the separation portion from other portions. When the selectivity of the chemical is large and thus the solution rate of the phosphorous glass is slow, the separation processing takes an unnecessarily long time with the above order and this is disadvantageous in terms of productivity. In this case, it is desirable to perform the separation processing after removing the phosphorous glass on the entire surface.

Figure 24:
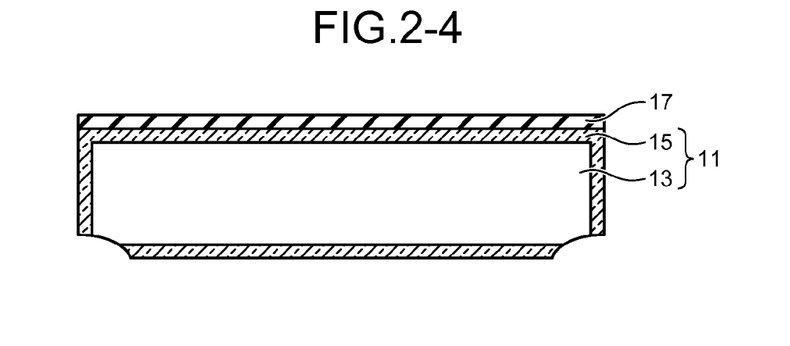

Subsequently, the anti-reflective film 17 for improving the photoelectric conversion efficiency is formed on the light-receiving-surface side of the P-type polycrystalline silicon substrate 11a, on which the N-type impurity diffusion layer 15 is formed (see FIG. 2-4). The anti-reflective film 17 is, for example, a silicon nitride film (SiN film). The anti-reflective film 17 is formed by, for example, a plasma CVD method. The silicon nitride film that serves as the anti-reflective film 17 is formed by using a mixed gas of silane and ammonia.

The film thickness and the refractive index of the anti-reflective film 17 are set to values that suppress the light reflection most. A film having two or more layers with different refractive indexes can be laminated as the anti-reflective film 17. Further, other deposition methods, such as a sputtering method, can be used to form the anti-reflective film 17. In addition, a silicon oxide film can be used as the anti-reflective film 17.

Figure 25:
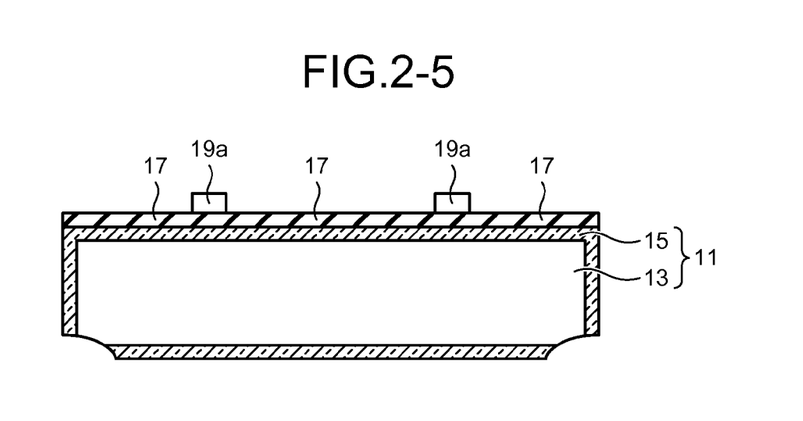

Subsequently, electrodes are formed by screen printing. First, the light-receiving-surface-side electrode 19 is formed (before baking). Specifically, after a silver paste 19a, which is a light-receiving-surface-side electrode material paste, is applied to the anti-reflective film 17, which is on the light-receiving-surface side of the semiconductor substrate 11, in the shapes of the surface silver grid electrodes 23 and the surface silver bus electrodes 25 by screen printing, the silver paste is dried (see FIG. 2-5).

Figure 26:
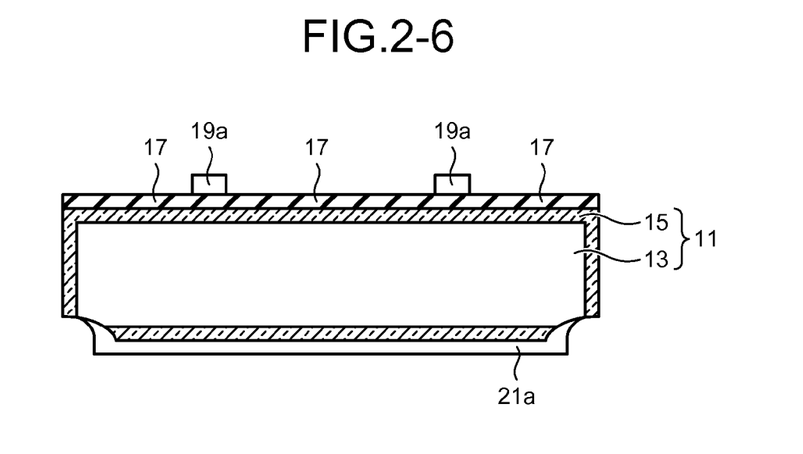

Subsequently, the back-surface-side electrode 21 is produced (before baking). Specifically, an aluminum paste 21a, which is an electrode material paste, is applied to the back-surface side of the semiconductor substrate 11 in the shape of the back-surface-side electrode 21 by screen printing, and then the aluminum paste 21a is dried (see FIG. 2-6).

Figure 27:
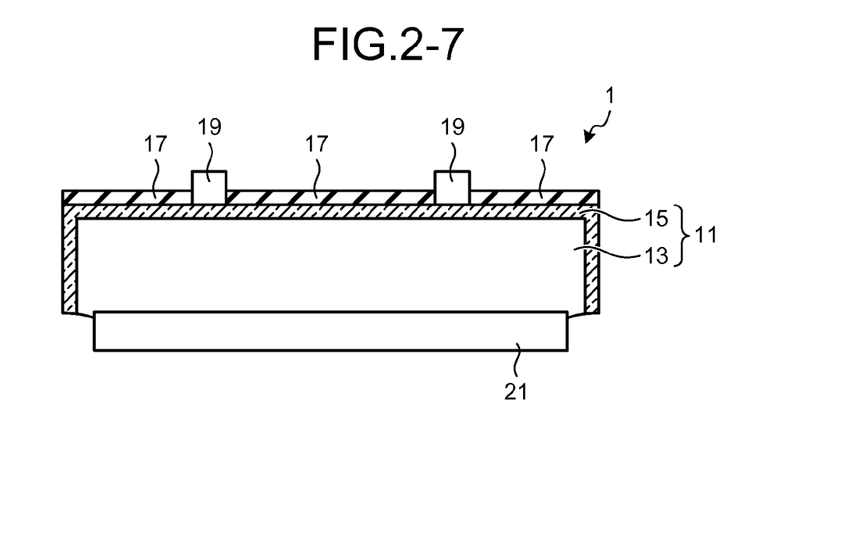

Thereafter, the surface silver grid electrodes 23 and the surface silver bus electrodes 25, which are the light-receiving-surface-side electrode 19, and the back-surface-side electrode 21 are obtained by baking the pastes (see FIG. 2-7). The baking is performed in an ambient atmosphere at a temperature selected from a range of, for example, 750° C. to 850° C. The baking temperature is selected while considering the cell structure and the type of the paste. Silver in the light-receiving-surface-side electrode 19 penetrates through the anti-reflective film 17; therefore, the N-type impurity diffusion layer 15 and the light-receiving-surface-side electrode 19 are electrically connected to each other. With this configuration, the N-type impurity diffusion layer 15 can achieve a good resistive junction with the light-receiving-surface-side electrode 19.

By performing the processes described above, the solar cell 1 shown in FIGS. 1-1 to 1-3 can be produced. The order of arranging the pastes, which are electrode materials, on the semiconductor substrate 11 can be changed between the light-receiving-surface side and the back-surface side.

Figure 3:
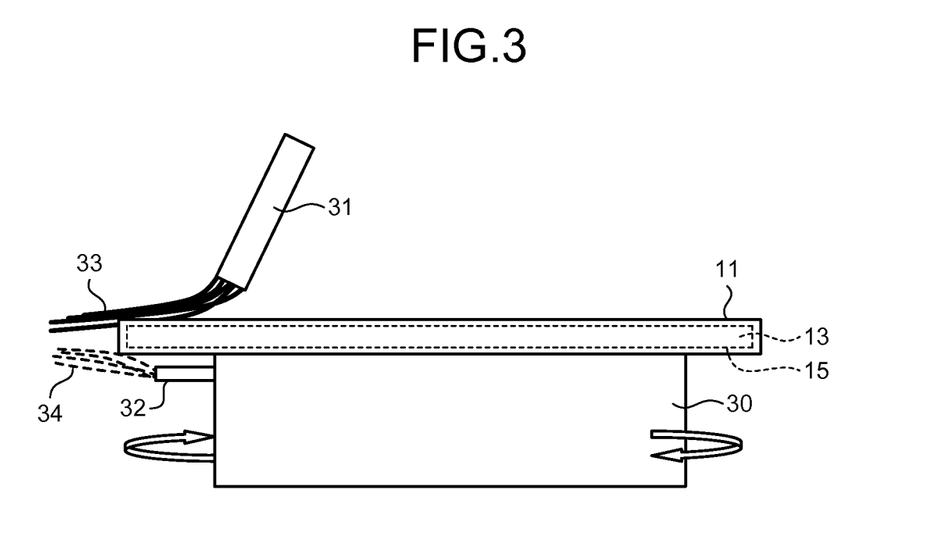
FIG. 3 is a schematic diagram of the state of an etching process in a manufacturing apparatus for a photovoltaic device.

Next, the etching process for junction separation according to the present embodiment is explained in detail below. FIG. 3 is a schematic diagram of the state of the etching process performed by the manufacturing apparatus for the photovoltaic device. The manufacturing apparatus includes a stage 30, an etching-fluid supply unit 31, and an air supply unit 32.

The stage 30 includes a setting surface on which the semiconductor substrate 11 is set. The stage 30 fixes the semiconductor substrate 11 on the setting surface by, for example, suction. The stage 30 is rotatable around a central axis perpendicular to the setting surface.

The etching-fluid supply unit 31 supplies an etchant 33 to the top surface of the semiconductor substrate 11 that is set on the stage 30. The etchant 33 is an etching fluid for removing the N-type impurity diffusion layer 15. The air supply unit 32 supplies air 34 on the bottom-surface side of the semiconductor substrate 11.

The semiconductor substrate 11 in which the PN junction is formed is set on the stage 30. On the stage 30, the semiconductor substrate 11 is set in a state in which the outer edge portion and the proximity thereof protrude outside the stage 30. The top surface of the semiconductor substrate 11 set on the stage 30 is a first surface, which is to be the back-surface side. The bottom surface of the semiconductor substrate 11 on the setting-surface side of the stage 30 is a second surface, which is to be the light-receiving-surface side. In the etching process, the manufacturing apparatus simultaneously performs supply of the etchant 33 in the etching-fluid supplying process and supply of the air 34 in the air supplying process while rotating the stage 30.

The etching-fluid supply unit 31 supplies the etchant 33 to the first surface of the semiconductor substrate 11 set on the stage 30. On the first-surface side, the etching-fluid supply unit 31 supplies the etchant 33 from a predetermined supply position toward the outer edge portion that is the position of the side surface of the semiconductor substrate 11. The etchant 33 can be, for example, a mixture of hydrofluoric acid and nitric acid or aqueous alkali hydroxide solution heated to a temperature ranging from 70 degrees to 90 degrees, although not specifically designated.

The air supply unit 32 supplies the air 34 in accordance with the supply of the etchant 33 by the etching-fluid supply unit 31. On the second-surface side of the semiconductor substrate 11, the air supply unit 32 supplies the air 34 from under the portion of the semiconductor substrate 11, which protrudes from the stage 30, toward the outer edge portion of the semiconductor substrate 11. The air supply unit 32 supplies the air 34 in the same direction as the direction in which the etching-fluid supply unit 31 supplies the etchant 33. The air 34 can be, for example, dried air, nitrogen, or the like.

When the etchant 33 is supplied while the semiconductor substrate 11 rotates, the etchant 33 spreads from the supply position toward the outer edge portion of the semiconductor substrate 11 by the centrifugal force, and moves from the outer edge portion away to the outside of the semiconductor substrate 11. The etching proceeds in the area that is brought into contact with the etchant 33. In a case of phosphorous diffusion, the depth of the junction is less than 0.5 micrometers in most cases; therefore, the amount of the etching is, for example, about 0.5 micrometers in terms of the depth. When the material exemplified above is used as the etchant 33, the etching rate with respect to silicon is about a few micrometers to 10 micrometers per minute; therefore, the etching time of the silicon is set to, for example, about a few seconds to ten and several seconds.

Even when the supply of the air 34 is not performed, most of the etchant 33 moves away by the centrifugal force without coming into contact with the area in which the junction is to be left. However, part of the etchant 33 may flow around to the light-receiving-surface side from the side surface of the semiconductor substrate 11. It is necessary to prevent the etchant 33 from flowing around to the light-receiving-surface side of the semiconductor substrate 11 because it reduces the power generating area.

In the present embodiment, the etchant 33 can be securely prevented from flowing to the light-receiving-surface side from the side surface of the semiconductor substrate 11 by the supply of the air 34 in addition to the centrifugal force. The etching of the side surface of the semiconductor substrate 11 can be adjusted appropriately depending on its status.

Figure 4:
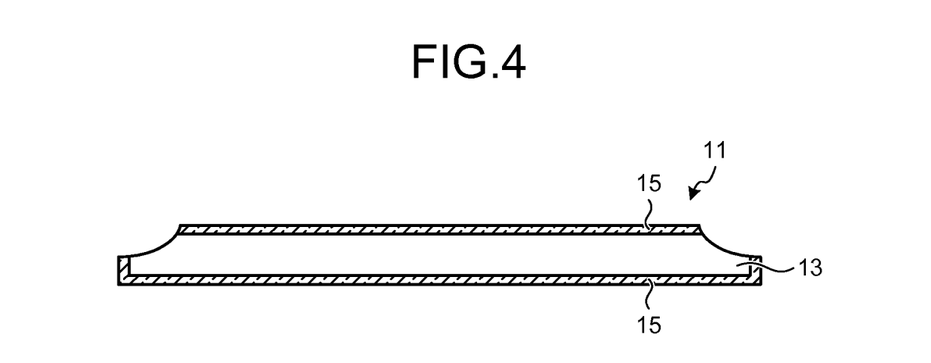
FIG. 4 is a cross-sectional view for explaining an area to be preferentially etched in a semiconductor substrate.

The etching of the back surface of the semiconductor substrate 11 is not limited to the case of targeting the entire surface. In the back surface, the area to be preferentially etched is an area other than the area where the back-surface-side electrode 21 is to be formed, for example, the range of about a few hundred micrometers to 2 millimeters of the outer edge portion. If a junction is left in this portion, a short-circuit is likely to occur due to the contact with the back-surface-side electrode 21. Even when the junction is separated, a portion between the separation portion and the end portion of the back-surface-side electrode 21 captures carriers in the vicinity thereof, which may act to impede power generation. Therefore, in order to achieve high efficiency of the solar cell 1, as shown in FIG. 4, the etching is performed in such a manner that the area of a predetermined range from the outer edge portion of the back surface of the semiconductor substrate 11 is etched with the highest priority.

On the other hand, in the area of the back surface of the semiconductor substrate 11, on which the back-surface-side electrode 21 is to be formed, the conductivity type is converted to a strong P-type again as the electrode material is baked regardless of the etching. Therefore, as compared to the area other than the area where the back-surface-side electrode 21 is to be formed, the area where the back-surface-side electrode 21 is to be formed has a low priority in etching. The area where the back-surface-side electrode 21 is to be formed can also be etched, but it is not essential. It is desirable that the etching-fluid supply unit 31 sets the supply position, direction, and flow rate of the etchant 33 such that the etchant 33 sufficiently reaches the area to be etched with the highest priority as described above.

According to the manufacturing method of the photovoltaic device of the present embodiment, junction separation can be achieved with good controllability and less damage by wet etching using the etchant 33. By supplying the etchant 33 to a desired position on the back-surface side and supplying the air to the light-receiving-surface side, the etchant 33 is prevented from flowing to the second-surface side of the semiconductor substrate 11 from the side surface of the semiconductor substrate 11 and thus the area where the junction is removed can be accurately limited.

According to the present embodiment, an appropriate etching rate and air spray power can be set with less constraint; therefore, the productivity can be increased. Furthermore, according to the present embodiment, a fluid bath having a large area is not required; therefore, the etching process can be performed in a compact-sized apparatus. Accordingly, effects are obtained where junction separation can be achieved with good controllability and less damage and high productivity can be achieved with a compact-sized manufacturing apparatus.

Second Embodiment

Figure 5:
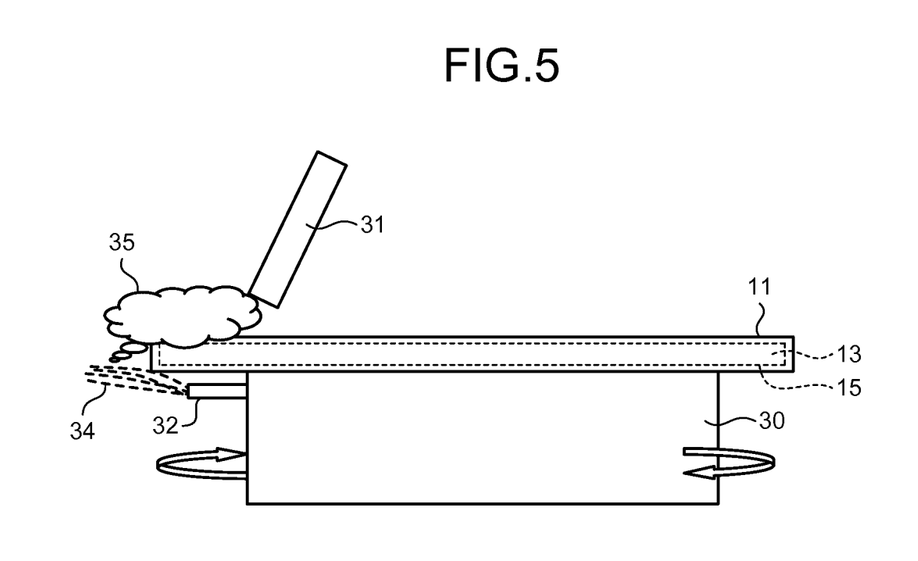
FIG. 5 is a schematic diagram of the state of an etching process in a manufacturing method of a photovoltaic device according to a second embodiment of the present invention.

FIG. 5 is a schematic diagram of a state of an etching process in a manufacturing method of a photovoltaic device according to a second embodiment of the present invention. Like parts as those in the first embodiment are designated by like reference signs and redundant explanations will be appropriately omitted.

The etching-fluid supply unit 31 supplies a foam-like etchant 35. The etchant 35 is an etching fluid for removing the N-type impurity diffusion layer 15. In the present embodiment, by using the foam-like etchant 35, the force that the semiconductor substrate 11 receives from the etchant 35 is reduced, as compared to a case of using a normal liquid etchant. Furthermore, the power of the air 34 for preventing the etchant 35 from flowing to the light-receiving-surface side can be reduced.

In a similar manner to the first embodiment, the present embodiment enables junction separation with good controllability and less damage and enables achievement of high productivity with a compact-sized manufacturing apparatus. Furthermore, in the present embodiment, the forces that the etchant 35 and the air 34 exert on the semiconductor substrate 11 are reduced; therefore, damage on the semiconductor substrate 11 can be reduced. Further, by reducing the power of the air 34, power consumption necessary to supply the air 34 can be reduced.

Third Embodiment

Figure 6:
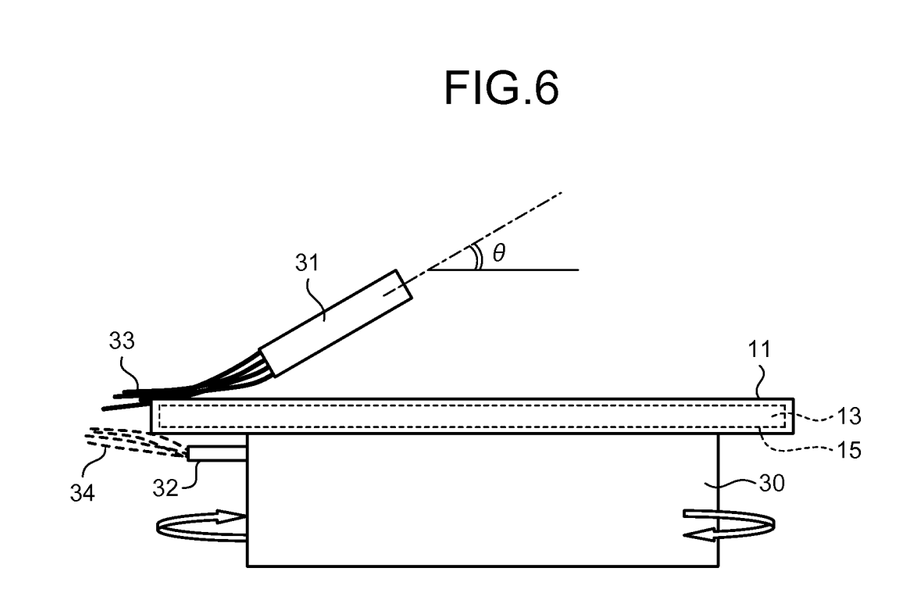
FIG. 6 is a schematic diagram of the state of an etching process in a manufacturing method of a photovoltaic device according to a third embodiment of the present invention.

FIG. 6 is a schematic diagram of a state of an etching process in a manufacturing method of a photovoltaic device according to a third embodiment of the present invention. Like parts as those in the first embodiment are designated by like reference signs and redundant explanations will be appropriately omitted.

The etching-fluid supply unit 31 is arranged such that an angle θ between the direction in which the etchant 33 is injected and the first surface of the semiconductor substrate 11 is set to be equal to or smaller than 30 degrees. The etching-fluid supply unit 31 supplies the etchant 33 at an angle equal to or smaller than 30 degrees with respect to the surface of the semiconductor substrate 11.

The etching-fluid supply unit 31 is arranged such that the angle at which the etchant 33 hits the semiconductor substrate 11 becomes shallow, for example, the angle θ is equal to or smaller than 30 degrees; therefore, the component acting in the vertical direction with respect to the surface of the semiconductor substrate 11, among the forces that depend on the speed component of the etchant 33, decreases. Furthermore, among the flow forces of the etchant 33, the component acting in the horizontal direction parallel to the surface of the semiconductor substrate 11 is increased; therefore, the component acting in the horizontal direction can be effectively used for preventing the etchant 33 from flowing around to the light-receiving-surface side. Further, the power of the air 34 for preventing the etchant 33 from flowing to the light-receiving-surface side can also be reduced.

In a similar manner to the first embodiment, the present embodiment enables junction separation with good controllability and less damage and enables achievement of high productivity with a compact-sized manufacturing apparatus. Furthermore, according to the present embodiment, by making the angle at which the etchant 33 hits the semiconductor substrate 11 shallow, damage on the semiconductor substrate 11 can be reduced and the etchant 33 can be effectively prevented from flowing to the light-receiving-surface side. The power of the air 34 can be reduced; therefore, power consumption necessary to supply the air 34 can be reduced.

Fourth Embodiment

Figure 7:
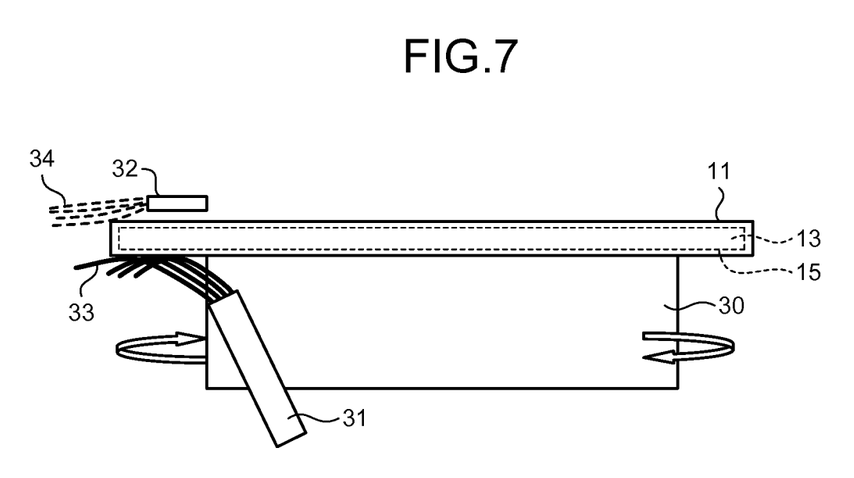
FIG. 7 is a schematic diagram of the state of an etching process in a manufacturing method of a photovoltaic device according to a fourth embodiment of the present invention.

FIG. 7 is a schematic diagram of a state of an etching process in a manufacturing method of a photovoltaic device according to a fourth embodiment of the present invention. Like parts as those in the first embodiment are designated by like reference signs and redundant explanations will be appropriately omitted.

The etching-fluid supply unit 31 supplies the etchant 33 to the bottom surface of the semiconductor substrate 11 set on the stage 30. The air supply unit 32 supplies the air 34 on the top-surface side of the semiconductor substrate 11.

The bottom surface of the semiconductor substrate 11 set on the stage 30 on the setting-surface side is the first surface, which is to be the back-surface side. The top surface of the semiconductor substrate 11 set on the stage 30 is the second surface, which is to be the light-receiving-surface side. The etching-fluid supply unit 31 supplies the etchant 33 to a portion of the first surface of the semiconductor substrate 11, which protrudes from the stage 30. On the first-surface side, the etching-fluid supply unit 31 supplies the etchant 33 from a predetermined supply position toward the outer edge portion that is the position on the side surface of the semiconductor substrate 11.

On the second-surface side of the semiconductor substrate 11, the air supply unit 32 supplies the air 34 from a position over the semiconductor substrate 11 toward the outer edge portion of the semiconductor substrate 11. The air supply unit 32 supplies the air 34 in the same direction as the direction in which the etchant 33 is supplied by the etching-fluid supply unit 31.

Among the forces that depend on the speed component of the etchant 33 supplied from the etching-fluid supply unit 31, the component acting in the vertical direction with respect to the surface of the semiconductor substrate 11 decreases due to the gravity acting on the etchant 33 itself. Furthermore, among the flow forces of the etchant 33, the component acting in the horizontal direction parallel to the surface of the semiconductor substrate 11 is increased; therefore, the component acting in the horizontal direction can be effectively used for preventing the etchant 33 from flowing around to the light-receiving-surface side. Further, the power of the air 34 for preventing the etchant 33 from flowing to the light-receiving-surface side can also be reduced.

In a similar manner to the first embodiment, the present embodiment enables junction separation with good controllability and less damage and enables achievement of high productivity with a compact-sized manufacturing apparatus. Furthermore, according to the present embodiment, by setting the surface of the semiconductor substrate 11 to be processed to face downward, damage on the semiconductor substrate 11 can be reduced and the etchant 33 can be effectively prevented from flowing to the light-receiving-surface side. By reducing the power of the air 34, power consumption necessary to supply the air 34 can be reduced.

Although the case of using a P-type silicon substrate as the semiconductor substrate has been explained in the above embodiments, the effects of the present invention described above can be obtained even in the case of a solar cell of the opposite conductivity type in which an N-type silicon substrate is used as the semiconductor substrate and a P-type diffusion layer is formed. Furthermore, although a polycrystalline silicon substrate has been used as the semiconductor substrate in the above embodiments, it is obvious that the effects of the present invention described above can be obtained even in the case of using a single-crystal silicon substrate as the semiconductor substrate.

Further, although the case where the substrate thickness of the semiconductor substrate is 200 micrometers has been explained in the above embodiments, a substrate that is thinned down to, for example, about 50 micrometers can be used as long as it is thickness enough for the substrate to support itself. Moreover, although the case where the size of the semiconductor substrate is 150 mm×150 mm has been explained in the above embodiments, it is obvious that the effects of the present invention described above can be obtained even in the case of using a substrate having a larger size or a smaller size.

INDUSTRIAL APPLICABILITY

As described above, the manufacturing method of a photovoltaic device according to the present invention is useful in a case of performing wet etching, which is a junction separation method useful for achieving high efficiency, in a small area in a compact manner, and is particularly suitable for achieving high efficiency in a solar cell and increasing productivity in manufacturing the solar cell.

REFERENCE SIGNS LIST 1 solar cell
11 semiconductor substrate
13 P-type polycrystalline silicon layer
15 N-type impurity diffusion layer
17 anti-reflective film
19 light-receiving-surface-side electrode
21 back-surface-side electrode
23 surface silver grid electrode
25 surface silver bus electrode
30 stage
31 etching-fluid supply unit
32 air supply unit
33, 35 etchant
34 air

The invention claimed is:

1. A manufacturing method of a photovoltaic device, comprising:
a step of forming an impurity diffusion layer by diffusing an impurity element in a surface of a silicon-based substrate;
an etching step of removing the impurity diffusion layer of an outer edge portion of a first-surface side of the silicon-based substrate, and
a step of forming an anti-reflective film on a second-surface side of the silicon based substrate, wherein
the etching step includes
an etching-fluid supplying step of, on the first-surface side, supplying an etching fluid that flows only within the outer edge portion of the silicon-based substrate towards the outer edge of the silicon-based substrate from a supply position, and
an air supplying step of, on the second-surface side, which is opposite to the first-surface side, of the silicon-based substrate, supplying air in a same direction as the etching fluid in accordance with supply of the etching fluid towards the outer edge of the silicon-based substrate at the etching-fluid supplying step.

2. The manufacturing method of a photovoltaic device according to claim 1, wherein the etching-fluid supplying step includes supplying the etching fluid in foam form.

3. The manufacturing method of a photovoltaic device according to claim 1, wherein the etching-fluid supplying step includes supplying the etching fluid at an angle equal to or smaller than 30 degrees with respect to a surface of the silicon-based substrate.

4. The manufacturing method of a photovoltaic device according to claim 1, wherein the etching step includes setting the silicon-based substrate with the first-surface side facing downward.

5. The manufacturing method of a photovoltaic device according to claim 1, wherein the etching-fluid dissolves a phosphorus glass produced during the step of forming an impurity diffusion layer, and
wherein the phosphorus glass is removed by the etching-fluid at the same time with a junction between the silicon-based substrate and the impurity diffusion layer in the etching step of removing the impurity diffusion layer.

6. The manufacturing method of a photovoltaic device according to claim 1, wherein the etching-fluid dissolves a phosphorus glass produced during the step of forming an impurity diffusion layer slower than a junction between the silicon-based substrate and the impurity diffusion layer, and
wherein the junction is removed after all of the phosphorus glass is removed in the etching step of removing the impurity diffusion layer.

7. A manufacturing apparatus for a photovoltaic device, comprising:
a stage on which a silicon-based substrate in which an impurity diffusion layer is formed is set;

an etching-fluid supply unit that supplies an etching fluid for removing the impurity diffusion layer of an outer edge portion of a first-surface side of the silicon-based substrate set on the stage;

an anti-reflective film unit that forms an anti-reflective film on a second surface of the silicon based substrate; and an air supply unit that supplies air on a second-surface side, which is opposite to the first-surface side, of the silicon-based substrate, wherein the etching-fluid supply unit supplies the etching fluid to flow only within the outer edge portion of the silicon-based substrate towards the outer edge of the silicon-based substrate from a supply position on the first-surface surface, and the air supply unit supplies the air in a same direction as the etching fluid on the second-surface side, in accordance with supply of the etching fluid towards the outer edge of the silicon-based substrate by the etching-fluid supply unit.

* * * * *